(12) United States Patent
Kuo

(10) Patent No.: US 10,957,760 B2
(45) Date of Patent: Mar. 23, 2021

(54) SEMICONDUCTOR STRUCTURE HAVING AIR GAP DIELECTRIC AND METHOD OF PREPARING THE SAME

(71) Applicant: NANYA TECHNOLOGY CORPORATION, New Taipei (TW)

(72) Inventor: Chin-Te Kuo, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/540,473

(22) Filed: Aug. 14, 2019

(65) Prior Publication Data

US 2021/0050413 A1    Feb. 18, 2021

(51) Int. Cl.
| | | |
|---|---|---|
| *H01L 29/06* | (2006.01) | |
| *H01L 21/768* | (2006.01) | |
| *H01L 23/31* | (2006.01) | |
| *H01L 21/56* | (2006.01) | |

(52) U.S. Cl.
CPC .......... *H01L 29/0649* (2013.01); *H01L 21/56* (2013.01); *H01L 21/7682* (2013.01); *H01L 21/76885* (2013.01); *H01L 23/3157* (2013.01)

(58) Field of Classification Search
CPC . H01L 29/0649; H01L 21/56; H01L 23/3157; H01L 21/7682; H01L 21/76885
See application file for complete search history.

(56) References Cited

U.S. PATENT DOCUMENTS

| | | | |
|---|---|---|---|
| 2010/0244255 | A1 | 9/2010 | Lee |
| 2011/0221062 | A1* | 9/2011 | Clevenger ......... H01L 21/02318 257/750 |
| 2018/0337186 | A1 | 11/2018 | Chang et al. |

FOREIGN PATENT DOCUMENTS

TW    201011863 A1    3/2010

OTHER PUBLICATIONS

Office Action issued in corresponding TW application No. 109102444 dated Oct. 29, 2020.

* cited by examiner

*Primary Examiner* — Matthew L Reames
(74) *Attorney, Agent, or Firm* — Muncy, Geissler, Olds & Lowe, P.C.

(57) ABSTRACT

The present disclosure provides a semiconductor structure having an air gap dielectric and a method for preparing the semiconductor structure. The method includes forming a conductive pillar over a substrate; forming a dielectric cap over the conductive pillar; transforming a sidewall portion of the conductive pillar into a first dielectric portion; and removing the first dielectric portion such that a width of the dielectric cap is greater than a width of a remaining portion of the conductive pillar.

11 Claims, 7 Drawing Sheets

SEMICONDUCTOR STRUCTURE HAVING AIR GAP DIELECTRIC AND METHOD OF PREPARING THE SAME

TECHNICAL FIELD

The present disclosure relates to a semiconductor structure and a method for preparing the same, and more particularly, to a semiconductor structure having an air gap dielectric and a method for preparing the same.

DISCUSSION OF THE BACKGROUND

Semiconductor devices are essential for many modern applications. With the advancement of electronic technology, semiconductor devices are becoming smaller in size while providing greater functionality and having greater amounts of integrated circuitry. Due to the miniaturized scale of semiconductor devices, various types and dimensions of semiconductor devices performing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices is becoming increasingly complicated. An increase in complexity of manufacturing and integration of the semiconductor device may cause deficiencies, such as signal interference between conductive elements. Accordingly, there is a continuous need to improve the manufacturing process of semiconductor devices so that the deficiencies can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In some embodiments of the present disclosure, a semiconductor structure is provided. The semiconductor structure comprises: a substrate; a plurality of conductive pillars disposed over the substrate; a plurality of dielectric pillars, disposed over the substrate, separated from the conductive pillars; a plurality of dielectric caps disposed over the conductive pillars, separated from the dielectric pillars; and a sealing layer disposed over the dielectric pillars and the dielectric caps.

In some embodiments, the semiconductor structure further comprises a plurality of air gaps respectively correspondingly positioned between the conductive pillars and the dielectric pillars.

In some embodiments, a bottom end of the sealing layer is lower than a top end of the dielectric pillars.

In some embodiments, a bottom end of the sealing layer is higher than a bottom end of the dielectric caps.

In some embodiments, a top end of the dielectric pillars is higher than a bottom end of the dielectric caps.

In some embodiments, a width of the dielectric cap is greater than a width of the conductive pillars.

In some embodiments, a distance between the conductive pillars is greater than a distance between the dielectric caps.

In some embodiments, a top width of the dielectric pillar is greater than a bottom width of the dielectric pillar.

In some embodiments, a bottom width of the dielectric pillar at one side of the conductive pillar is different from a bottom width at another side of the conductive pillar.

In some embodiments of the present disclosure, a method for preparing a semiconductor structure is provided. The method comprises: forming a plurality of composite pillars over a substrate, wherein the composite pillars include conductive pillars and dielectric caps over the conductive pillars over a substrate; forming a plurality of spacers flanking the composite pillar; forming a plurality of dielectric pillars over the substrate, between the spacers; removing the spacers to expose sidewalls of the conductive pillars; transforming sidewall portions of the conductive pillars into transformed portions; removing the transformed portions; and forming a sealing layer over the dielectric pillars and the dielectric caps.

In some embodiments, a sidewall of the conductive pillar is substantially coplanar with the sidewall of the dielectric cap before the transformed portion of the conductive pillar is formed.

In some embodiments, the step of transforming the sidewall portion of the conductive pillar further comprises performing a heat treatment process on the conductive pillar to form the transformed portion over the sidewall of the conductive pillar, wherein a material of the transformed portion is different from a material of the dielectric cap.

In some embodiments, the heat treatment process is an oxidation process or a nitridation process, and the transformed portion is covered by the dielectric cap.

In some embodiments, the sealing layer covers the dielectric pillars and the dielectric caps such that an air gap is formed between the dielectric cap, the conductive pillar, the dielectric pillar and the sealing layer.

In some embodiments, a bottom end of the sealing layer is lower than a top end of the dielectric pillars.

In some embodiments, a bottom end of the sealing layer is higher than a bottom end of the dielectric caps.

In some embodiments, a top end of the dielectric pillars is higher than a bottom end of the dielectric caps.

In some embodiments, a width of the dielectric cap is greater than a width of the conductive pillars.

In some embodiments, a distance between the conductive pillars is greater than a distance between the dielectric caps.

In some embodiments, a top width of the dielectric pillar is greater than a bottom width of the dielectric pillar, and the bottom width of the dielectric pillar at one side of the conductive pillar is different from a bottom width at another side of the conductive pillar.

The semiconductor structure disclosed in the present disclosure has gaps between the conductive pillars and the dielectric pillars, and the sealing layer seals the gaps from the top to form enclosed air gaps. Since air is a dielectric material with a considerably low dielectric constant, the resultant air gap-dielectric pillar combination between the conductive pillars provides a dielectric structure with lower dielectric constant than that of prior arts. In some embodiments, the dielectric pillars can be manufactured with conventional materials, so the dielectric constant can be lowered without using unfamiliar materials. Thus, the semiconductor structure provided in the present disclosure can reduce the unwanted parasitic capacitance without extensive research and development. As a result, a device using the provided semiconductor structure has an enhanced performance and reasonable cost.

Since conventional materials can be used to form the dielectric pillars in the present disclosure, the method of preparing the semiconductor structure is highly compatible with prior art. In other words, no new equipment or techniques are required for manufacturing the low κ semiconductor structure.

Methods for preparing a semiconductor structure are also provided in accordance with some embodiments of the disclosure. The method for preparing the semiconductor structure includes transforming a sidewall portion of a conductive pillar into a transformed portion (dielectric portion), and then removing the dielectric portion. As the dielectric portion is removed, a width of a dielectric structure over the conductive pillar is greater than a width of a remaining portion of the conductive pillar, while the height of the conductive pillar remains the same. In other words, the aspect ratio of the conductive pillar becomes higher, i.e., the present disclosure can prepare a high aspect ratio conductive pillar, which serves as a semiconductor structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
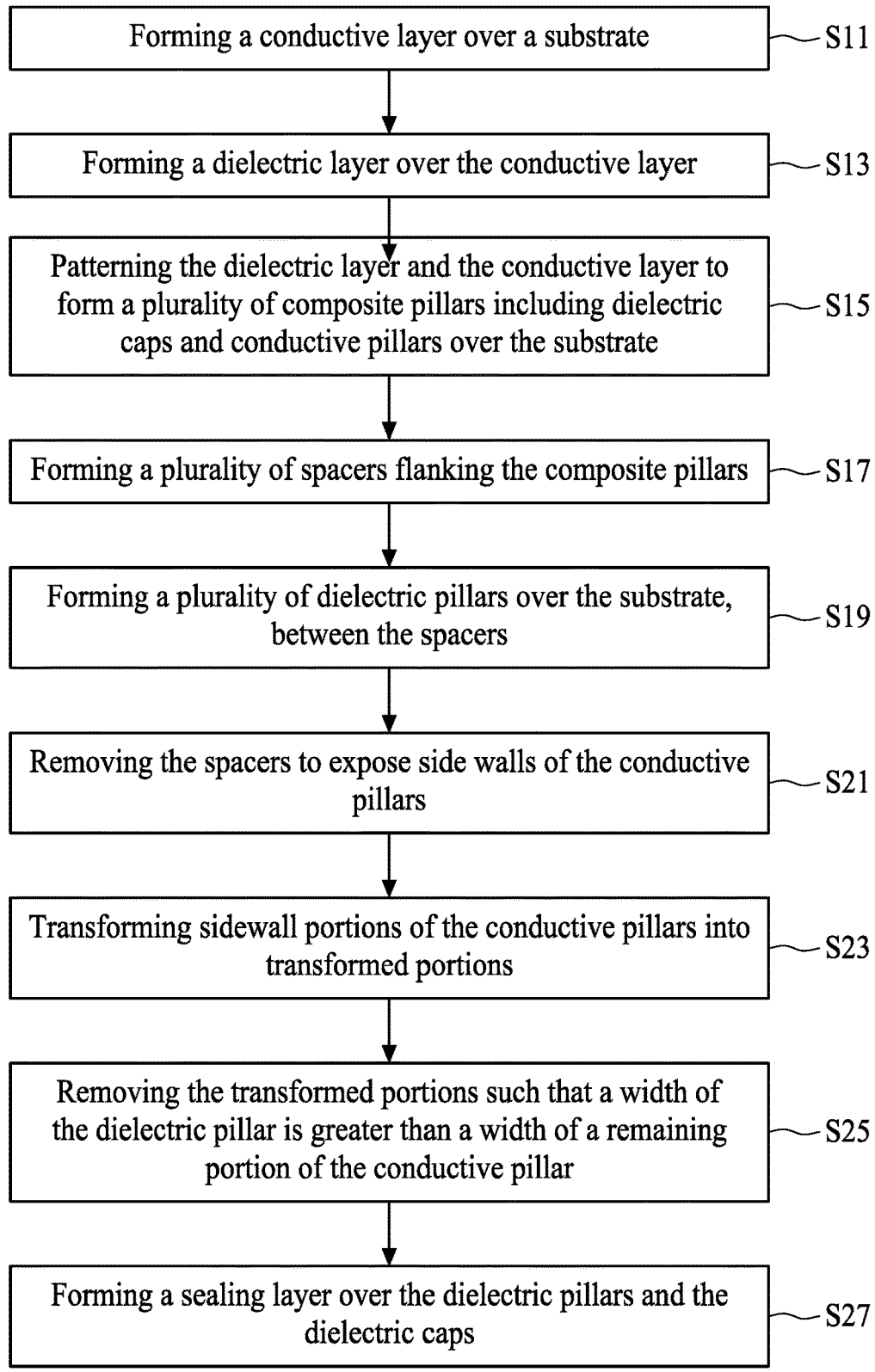
FIG. 1 is a flow diagram illustrating a method of preparing a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 of preparing a semiconductor structure, in accordance with some embodiments of the present disclosure. The method 10 includes steps S11, S13, S15, S17, S19, S21, S23, S25, and S27.

The steps S11 to S27 of FIG. 1 are first introduced briefly and then elaborated in connection with FIGS. 2 to 12. The method 10 begins at step S11, in which a conductive layer is formed over a substrate. In some embodiments, the substrate includes various passive and active microelectronic devices, and the conductive layer is used to form electrical connections between the microelectronic devices and other devices formed over the conductive layer. At step S13, a dielectric layer is formed over the conductive layer.

At step S15, the dielectric layer and the conductive layer are then patterned to form a plurality of composite pillars over the substrate, wherein the composite pillars include conductive pillars and dielectric caps over the conductive pillars. In some embodiments, the patterning process is performed on the dielectric layer and the conductive layer using a mask over the dielectric layer. At step S17, a plurality of spacers are formed flanking the composite pillar. At step S19, a plurality of dielectric pillars are formed over the substrate, between the spacers. At step S21, the spacers are removed to expose the sidewall portions of the conductive pillars.

At step S23, the sidewall portions of the conductive pillars are transformed into transformed portions. In some embodiments, the transformed portions are formed by performing a heat treatment process. At step S25, the transformed portions are removed. In some embodiments, the etching selectivities of the transformed portions with respect to the dielectric structures are high. In some embodiments, at step S27, a sealing layer is formed over the dielectric pillars and the dielectric caps. In some embodiments, air gaps are formed between the sealing layer, the dielectric pillars and the remaining portions of the conductive pillars.

FIGS. 2 to 12 are schematic cross-sectional views illustrating various stages of preparing a semiconductor structure 100 by the method 10 of FIG. 1 in accordance with some embodiments of the present disclosure.

Figure 2:
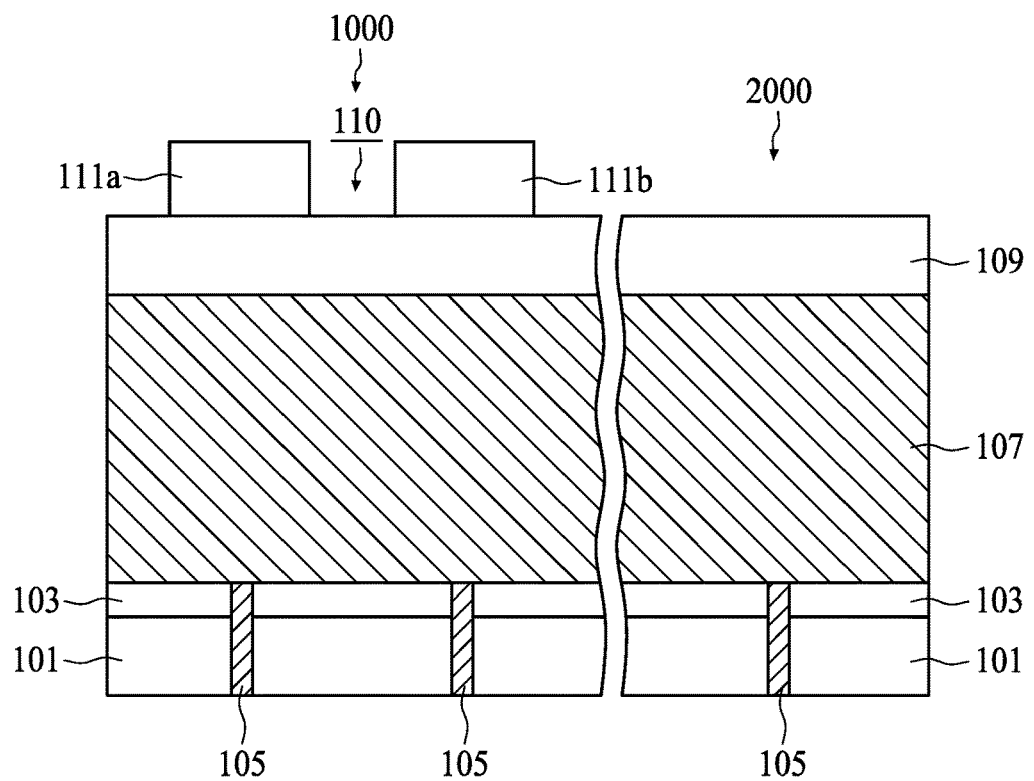
FIGS. 2 to 12 are schematic cross-sectional views illustrating various stages of preparing a semiconductor structure by the method of FIG. 1 in accordance with some embodiments of the present disclosure.

As shown in FIG. 2, a substrate 101 is provided or received. In some embodiments, the substrate 101 may include a semiconductor substrate such as a silicon substrate. In some embodiments, the substrate 101 includes other elementary semiconductor materials such as germanium (Ge). In some embodiments, the substrate 101 includes a compound semiconductor such as gallium arsenide, gallium phosphide, indium phosphide, indium arsenide, and/or indium antimonide. In some embodiments, the substrate 101 includes an alloy semiconductor such as SiGe, GaAsP, AlInAs, AlGaAs, GaInAs, GaInP, and/or GaInAsP. Alternatively, the substrate 101 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In addition, the substrate 101 may be a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

Depending on the IC fabrication stage, the substrate 101 may include various material layers (e.g., dielectric layers, semiconductor layers, and/or conductive layers) configured to form IC features (e.g., doped regions, isolation features, gate features, source/drain features, interconnect features, other features, or combinations thereof). For example, a dielectric layer 103 is formed over the substrate 101 as shown in FIG. 2. In some embodiments, the dielectric layer 103 is made of silicon oxide ($SiO_2$), silicon nitride (SiN), silicon carbide (SiC), silicon oxynitride (SiON), silicon oxycarbide (SiOC), silicon carbonitride (SiCN), silicon oxide carbonitride (SiOCN), another suitable dielectric material, or a combination thereof.

The substrate 101 of FIG. 2 has been simplified for the sake of clarity. It should be noted that additional features can be added in the substrate 101, and some of the features described below can be replaced, modified, or eliminated in other embodiments.

In the depicted embodiment, a plurality of conductive plugs 105 are formed in the substrate 101 and the dielectric layer 103. More specifically, the conductive plugs 105 are formed to penetrate through the dielectric layer 103 and the substrate 101. However, in other embodiments, the substrate 101 is not penetrated by the conductive plugs 105. In some embodiments, the conductive plugs 105 are disposed to form electrical connections between the devices in the semiconductor substrate 101 and other devices formed over the dielectric layer 103.

In some embodiments, the conductive plugs 105 are made of copper (Cu), aluminum (Al), silver (Ag), tungsten (W), another conductive material, or a combination thereof, and the conductive plugs 105 are formed by an etching process and a subsequent deposition process. In addition, the conductive plugs 105 may be through-silicon vias or through-substrate vias (TSVs) in accordance with some embodiments.

Moreover, the substrate 101 includes a first region 1000 and a second region 2000. In some embodiments, the pattern density of the first region 1000 of the substrate 101 is greater than the pattern density of the second region 2000. Therefore, in these embodiments, the first region 1000 may be referred to as the pattern-dense region such as the cell region in a DRAM, and the second region 2000 may be referred to as the pattern-sparse region such as the peripheral circuit region in the DRAM.

Still referring to FIG. 1 and FIG. 2, the method 10 at step S11 forms a conductive layer 107 over the dielectric layer 103, and the method 10 at step S13 forms a dielectric layer 109 over the conductive layer 107. In some embodiments, the conductive layer 107 is made of polycrystalline silicon (polysilicon), tungsten (W), aluminum (Al), copper (Cu), another conductive material, or a combination thereof, and the dielectric layer 109 is made of silicon oxide ($SiO_2$), silicon nitride (SiN), silicon carbide (SiC), silicon oxynitride (SiON), silicon oxycarbide (SiOC), silicon carbonitride (SiCN), silicon oxide carbonitride (SiOCN), another applicable dielectric material, or a combination thereof. In addition, the conductive layer 107 and the dielectric layer 109 may be formed by deposition processes, such as a chemical vapor deposition (CVD) process, a physical vapor deposition (PVD) process, an atomic layer deposition (ALD) process, a spin-coating process, a sputtering process, other suitable processes, or combinations thereof.

Because the problem of crosstalk (i.e., signal interference) between adjacent conductive pillars is more serious in the first region 1000 (i.e., the pattern-dense region) than in the second region 2000 (i.e., the pattern-sparse region), the following processes are performed on the first region 1000. However, these are merely examples and are not intended to be limiting. For example, in some other embodiments, the following processes are also performed on the second region 2000.

Figure 3:
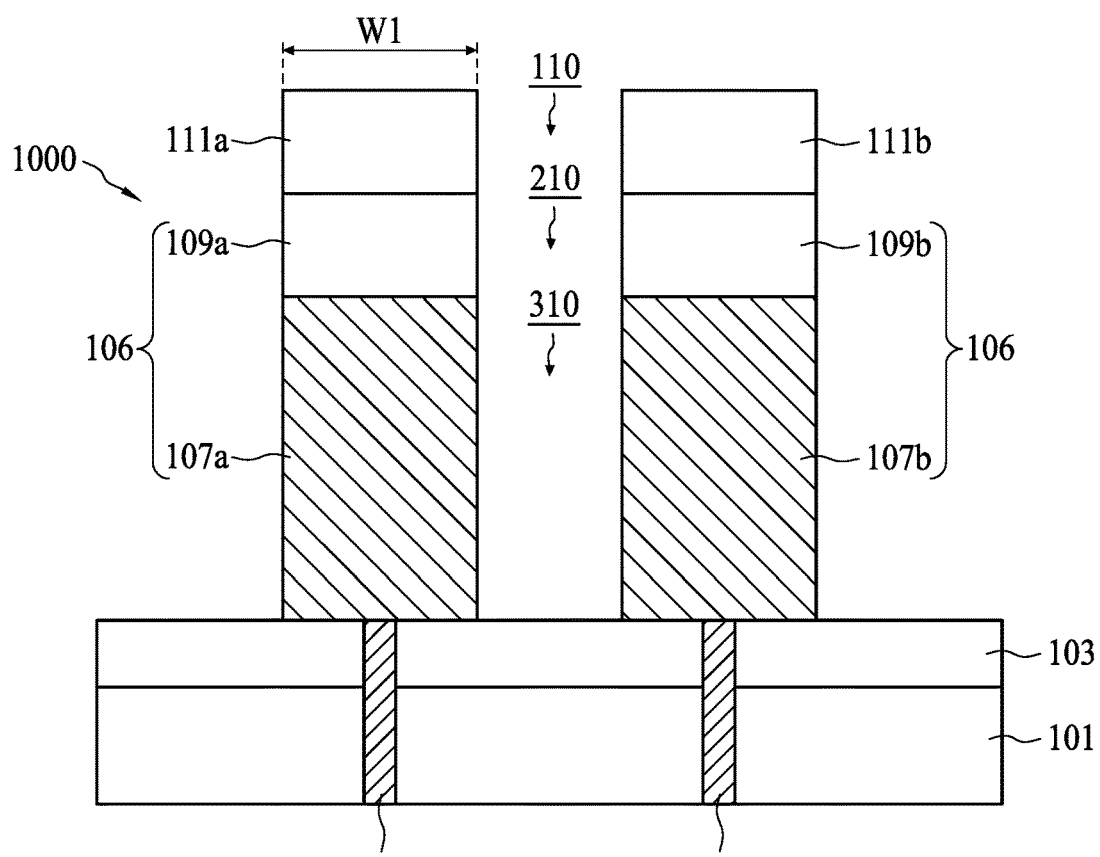

Referring to FIGS. 2 and 3, the method 10 at step S15 performs a patterning process on the dielectric layer 109 and the conductive layer 107. In some embodiments, the patterning process starts by forming a mask including a mask pattern 111a and a mask pattern 111b over the dielectric layer 109, wherein an opening 110 is formed between the mask patterns 111a and 111b, as shown in FIG. 2. The mask patterns 111a and 111b may be formed by depositing a mask layer (not shown) covering the dielectric layer 109. A patterned photoresist layer (not shown) may then be formed over the mask layer.

The patterned photoresist layer may be formed by a deposition process and a patterning process. The deposition process for forming the patterned photoresist layer may include a CVD process, a high-density plasma chemical vapor deposition (HDPCVD) process, a spin-coating process, a sputtering process, or another suitable process. The patterning process for forming the patterned photoresist layer may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include dry etching (e.g., reactive-ion etching (RIE)), wet etching and/or other etching methods.

In some embodiments, the mask layer is made of silicon oxide, silicon nitride, silicon oxynitride, or another suitable material, and the mask layer may be formed by a deposition process, which may include a CVD process, an HDPCVD process, a spin-coating process, a sputtering process, or another suitable process. After the patterned photoresist layer is formed, the mask layer is etched using the patterned photoresist layer as a mask. As a result, the mask including the mask patterns 111a and 111b with the opening 110 between them is obtained. The patterned photoresist layer may then be removed.

Next, as shown in FIG. 3, the dielectric layer 109 and the conductive layer 107 are etched using the mask patterns 111a and 111b as a mask. As a result, a dielectric cap 109a and a dielectric cap 109b are formed with an opening 210 between them, and a conductive pillar 107a and a conductive pillar 107b are formed with an opening 310 between them. In some embodiments, the top surface of the dielectric layer 103 is exposed by the opening 310. In some embodiments, the steps S11, S13 and S15 are also performed in the second region 2000 to form the conductive pillar 107a over the conductive plug 105 in the second region 2000.

It should be noted that the dielectric layer 109 and the conductive layer 107 are etched using the same mask. Thus, the sidewalls of the conductive pillar 107a are substantially coplanar with the sidewalls of the dielectric cap 109a, and the sidewalls of the conductive pillar 107b are substantially coplanar with the sidewalls of the dielectric cap 109b, in accordance with some embodiments. Within the context of this disclosure, the word "substantially" means preferably at least 90%, more preferably 95%, even more preferably 98%, and most preferably 99%.

More specifically, the top surfaces of the conductive pillars 107a and 107b are entirely covered by the dielectric caps 109a and 109b. In some embodiments, as shown in the cross-sectional view of FIG. 3, the width of the dielectric cap 109a and the width of the conductive pillar 107a are substantially the same, and are defined as the width W1. Similarly, the width of the dielectric cap 109b and the width of the conductive pillar 107b are substantially the same. After the openings 210 and 310 are formed, the mask including the mask patterns 111a and 111b is removed.

Figure 4:
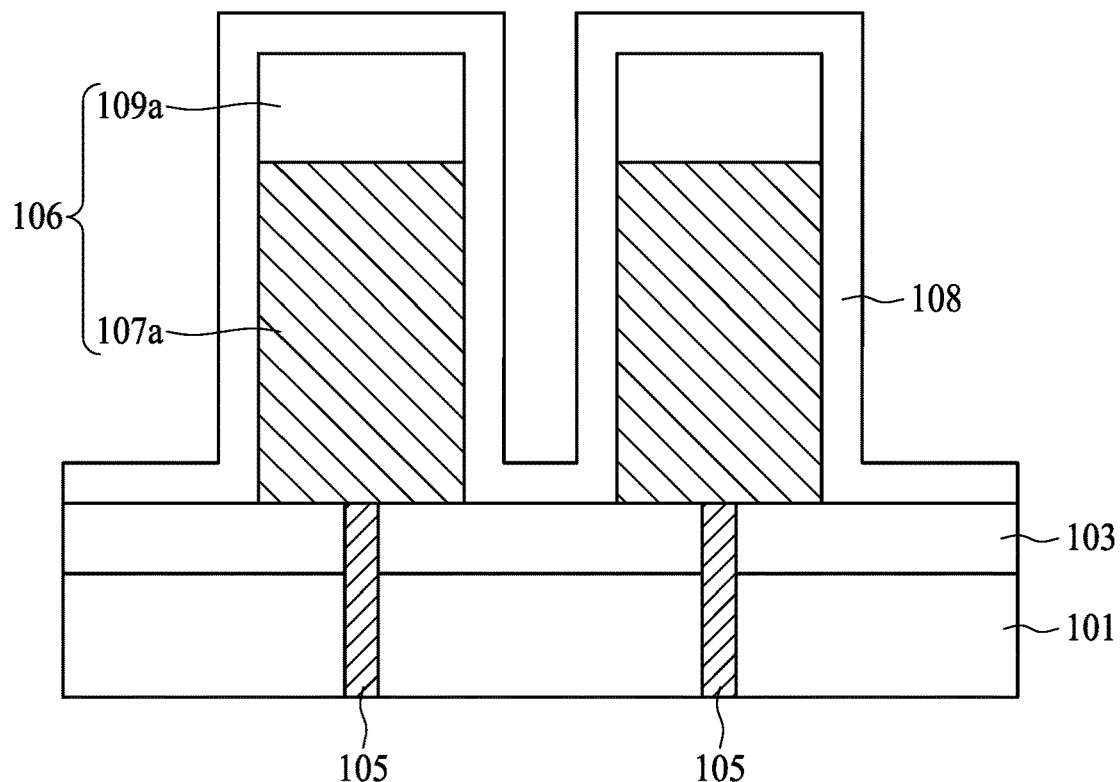
Figure 5:
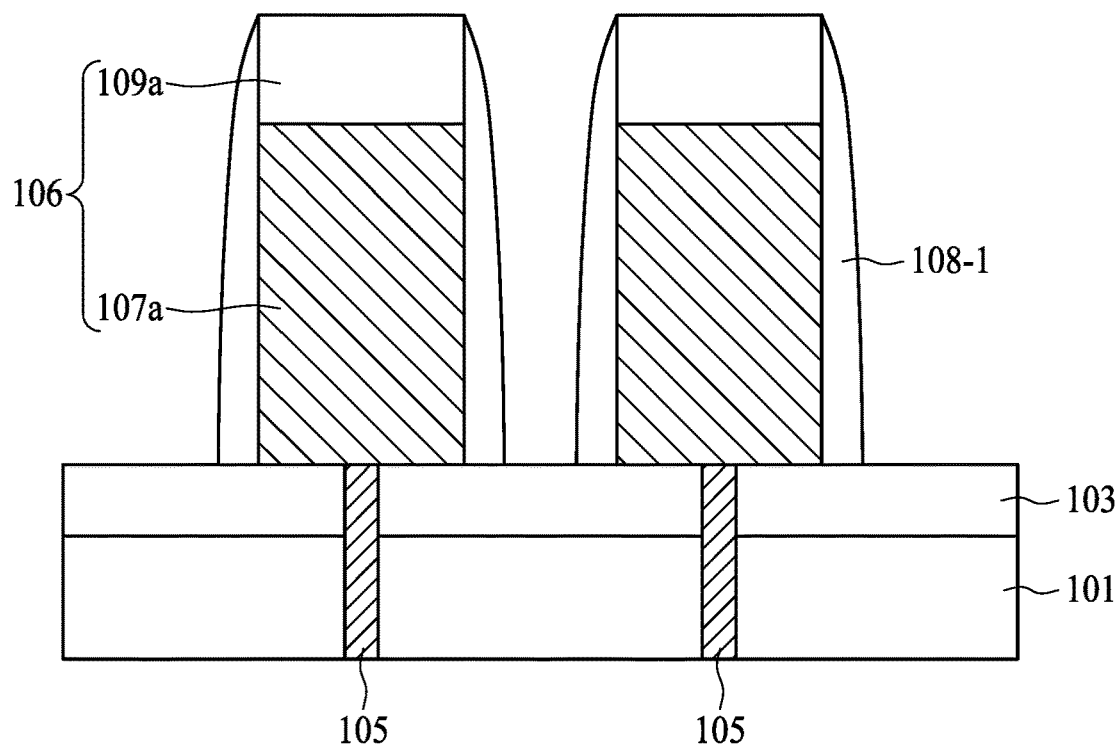

Next, as shown in FIG. 4 and FIG. 5, in step S17, a plurality of spacers 108-1 are formed flanking the composite pillars 106 including the conductive pillars 107a and 107b and the dielectric caps 109a and 109b. In some embodiments, the formation of the spacers 108-1 includes forming a spacer layer 108 on the dielectric layer 103 and the composite pillars 106, covering the top and the sides of the composite pillars 106, as shown in FIG. 4.

In some embodiments of the present disclosure, the spacer layer 108 may be silicon oxide or doped silicon oxide. In such embodiments, the spacer layer 108 can be formed by LPCVD with tetraethyl orthosilicate (TEOS), which produces silicon oxide under high temperature. The spacer layer 108 can then be etched to form the spacers 108-1. In some embodiments, the etching is an anisotropic etching process such as dry etching with plasma. The anisotropic etching process etches away the horizontal part of the spacer layer 108 on the dielectric layer 103 and on the top surface of the composite pillars 106, but only partly removes the vertical part of the spacer layer 108 flanking the side of the composite pillars 106 so that the remaining spacer layer 108 forms the spacers 108-1, as shown in FIG. 5.

Figure 6:
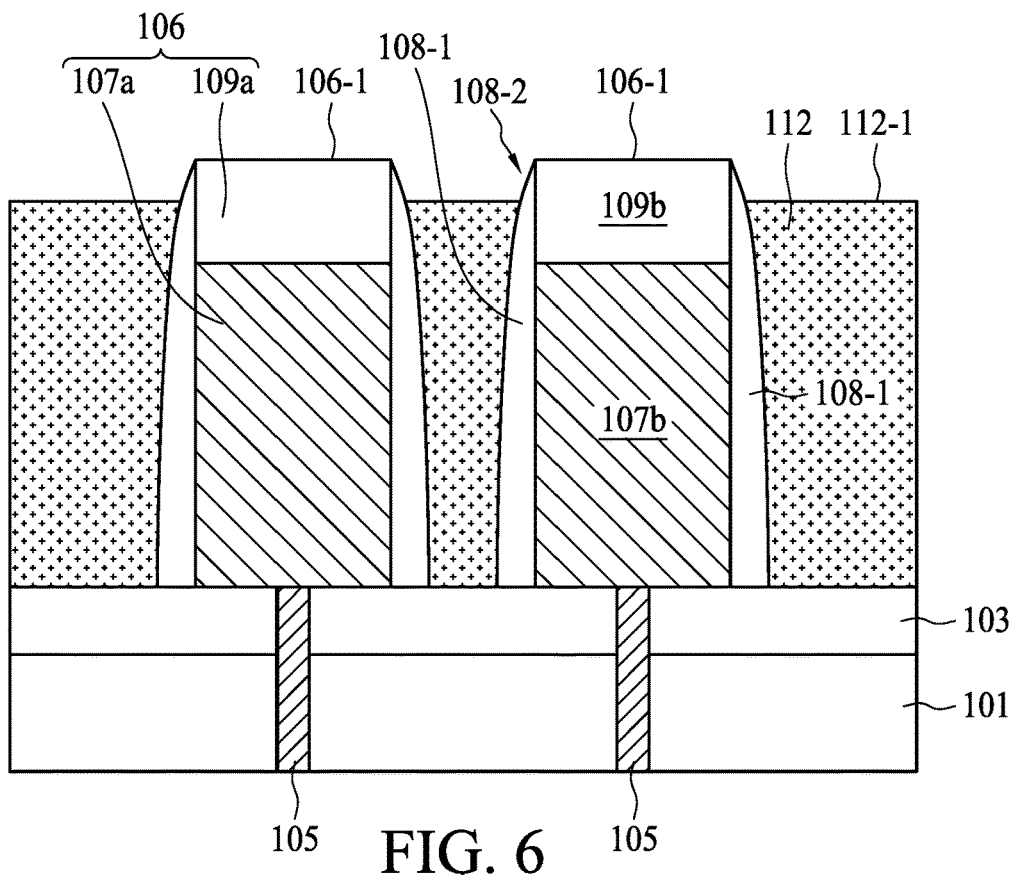

Please refer to FIG. 6. Next, in step S19, a plurality of dielectric pillars 112 are formed over the dielectric layer 103 of the substrate 101, between the spacers 108-1. In some embodiments, the dielectric pillars 112 are formed by spin coating. In some embodiments, the top end 112-1 of the dielectric pillars 112 is lower than the top end 106-1 of the composite pillars 106, and the top portion 108-2 of the spacers 108-1 is exposed.

In some embodiments, the dielectric pillars 112 may be hydrogen silsesquioxane, cyclotene, poly(arylene ether), aerogel of silicon oxide, or xerogel of silicon oxide. In some other embodiments, the dielectric pillars 112 formed by first filling a dielectric material between the spacers 108-1 and then drying or curing the dielectric materials to form the dielectric pillars 112. For example, where silica gels are used for forming the dielectric pillars 112, the flowable dielectric material, namely TEOS with solvent, is dispensed on the center of the semiconductor structure 100 on a spin coater (not shown). The semiconductor structure 100 is then rotated at high speed to spread the dielectric material by centrifugal force. Since the dielectric material is flowable, it can easily fill spaces between the spacers. Rotation is continued while the dielectric material spins off the edges of the semiconductor structure 100, until the desired thickness of the dielectric material is achieved. The thickness of the dielectric material can be controlled by the angular speed of the spinning. The thickness also depends on the viscosity and concentration of the dielectric material. In such embodiments, the dielectric material needs to be cured to form the dielectric pillars 112. If the dielectric material is dried by evaporation, then the dielectric pillars 112 comprise silica xerogel; if the dielectric material is dried by supercritical drying, then the dielectric pillars 112 comprise silica aerogel.

Figure 7:
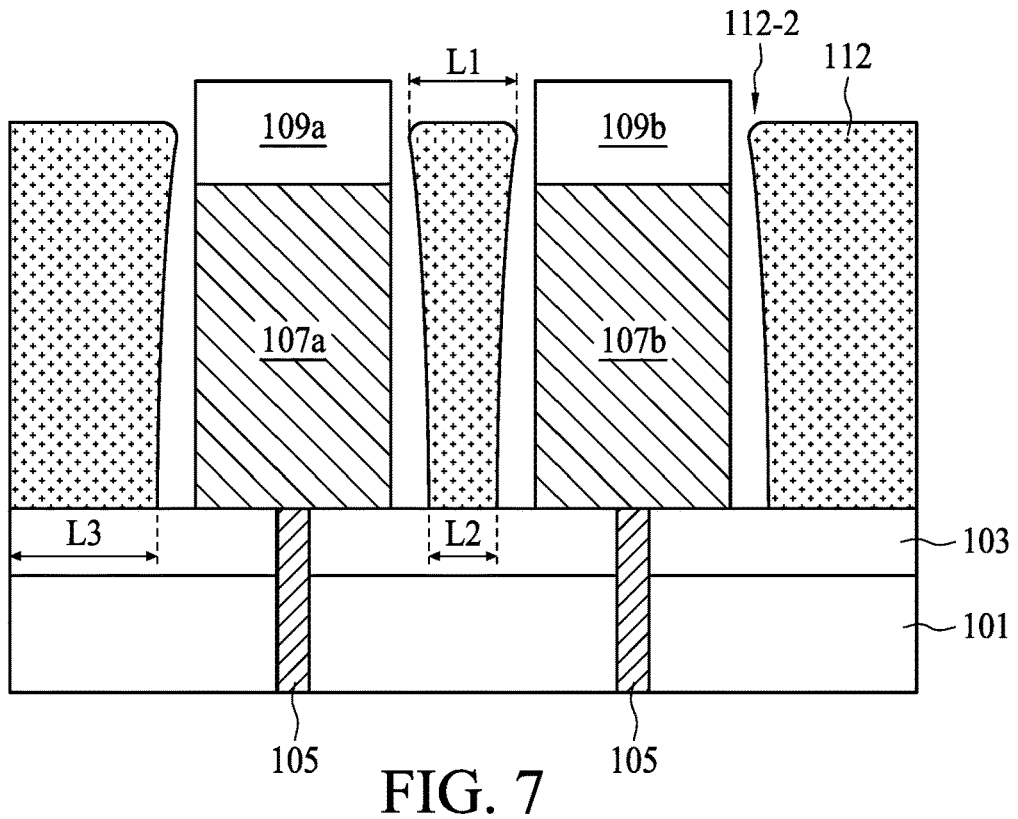

Next, please refer to FIG. 7. In step S21, the spacers 108-1 are removed to expose the sidewalls of the conductive pillars 107a and 107b. In some embodiments, the spacers 108-1 can be removed by an etching process. For example, the spacers 108-1 may be formed of doped silicon dioxide, which can be removed by etching the spacers 108-1 with vapor hydrofluoric acid (VHF). Since VHF is highly corrosive to silicon dioxide but only mildly etches metal, the use of VHF may effectively remove the spacers 108-1 while not damaging the remaining portion of the semiconductor structure 100 such as the conductive pillars 107a and 107b if, for example, the conductive pillars 107a and 107b are made of metal. In some embodiments, after removing the spacers 108-1 by VHF, the dielectric pillars 112 have rounded corners 112-2.

In some embodiments, after removing the spacers 108-1, the top width L1 of the dielectric pillar 112 is greater than the bottom width L2 of the dielectric pillar 112. In some embodiments, the bottom width L2 of the dielectric pillar 112 at one side (right side) of the conductive pillar 107a is different from (less than) the bottom width L3 of the dielectric pillar 112 at another side (left side) of the conductive pillar 107a.

Figure 8:
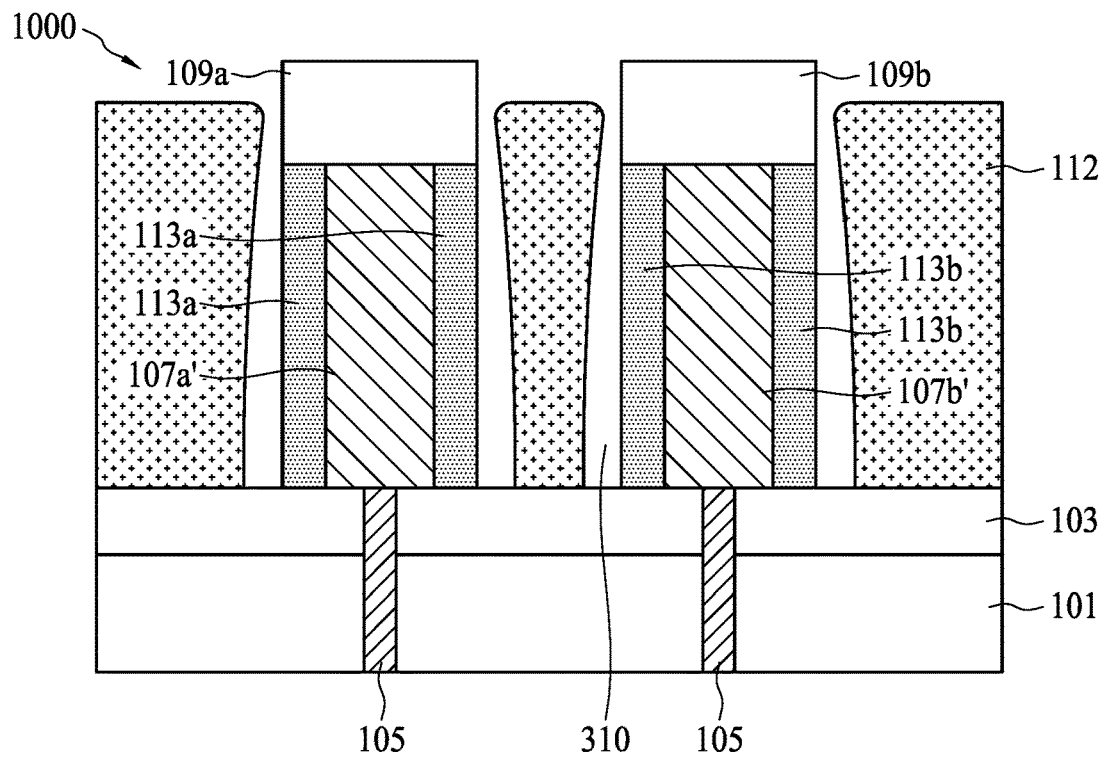

As shown in FIG. 8, the method 10 at step S23 transforms sidewall portions of the conductive pillars 107a and 107b into transformed portions 113a and 113b. As a result, the transformed portions 113a are formed over opposite sidewalls of the remaining portion of the conductive pillar 107a', and the transformed portions 113b are formed over opposite sidewalls of the remaining portion of the conductive pillar 107b'.

In some embodiments, the transformed portions 113a are covered by the dielectric cap 109a, and the transformed portions 113b are covered by the dielectric cap 109b. In some embodiments, the transformed portions 113a protrude from the sidewalls of the dielectric cap 109a, and the transformed portions 113b protrude from the sidewalls of the dielectric cap 109b. However, the transformed portions 113a and 113b are at least partially covered by the dielectric caps 109a and 109b, respectively.

Moreover, in some embodiments, the transformed portions 113a and 113b are dielectric portions formed by performing a heat treatment process, which includes an oxidation process, a nitridation process, another suitable process or a combination thereof. In order to provide a high etching selectivity during the subsequent etching process, the material of the transformed portions 113a and 113b should be different from the material of the dielectric caps 109a and 109b. Therefore, the gas applied during the heat treatment process is selected based on the material of the dielectric caps 109a and 109b.

For example, if the dielectric caps 109a and 109b are made of silicon oxide, nitrogen may be diffused into the sidewall surfaces of the conductive pillars 107a and 107b during the heat treatment process (i.e., nitridation process), and the transformed portions 113a and 113b may be made of nitride, such as silicon nitride.

In addition, if the dielectric caps 109a and 109b are made of silicon nitride, oxygen may be diffused into the sidewall surfaces of the conductive pillars 107a and 107b during the heat treatment process (i.e., oxidation process), and the transformed portions 113a and 113b may be made of silicon oxide ($SiO_2$), tungsten oxide (WO), aluminum oxide ($Al_2O_3$), copper oxide (CuO), or a combination thereof, depending on the material of the conductive pillars 107a and 107b.

Figure 9:
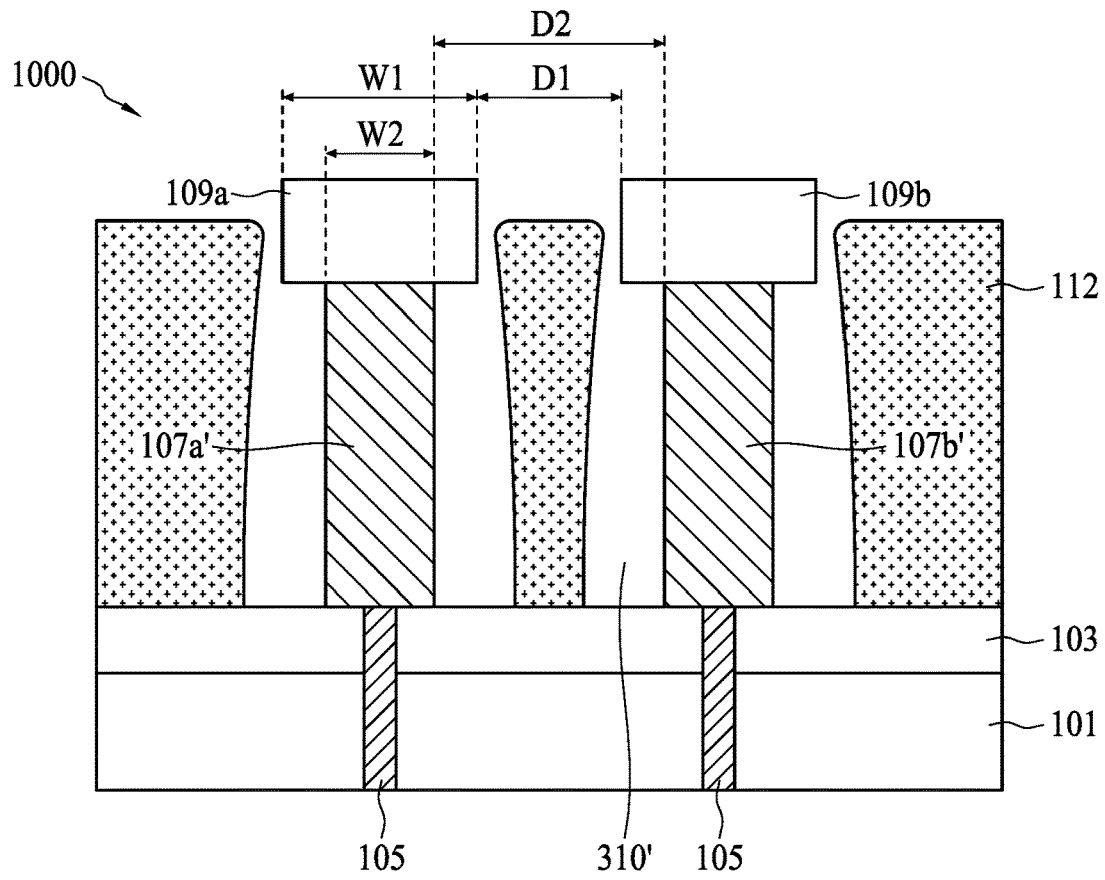

As shown in FIG. 9, the method 10 at step S25 removes the transformed portions 113a and 113b. In some embodiments, the transformed portions 113a and 113b are removed by an etching process. The etching process may include dry etching (e.g., RIE), wet etching and/or other etching methods.

In some embodiments, the materials of the transformed portions 113a, 113b and the dielectric caps 109a, 109b are selected such that the etching selectivities of the transformed portions 113a, 113b with respect to the dielectric caps 109a, 109b are high. Therefore, the transformed portions 113a and 113b are removed by the etching process while the dielectric caps 109a and 109b may be substantially left intact.

After the removal of the transformed portions 113a and 113b, an enlarged opening 310' is obtained. It should be noted that a distance D2 between the remaining portions of the conductive pillars 107a' and 107b' (i.e., the width of the enlarged opening 310') is greater than a distance D1 (i.e., the width of the opening 210) between the dielectric caps 109a and 109b, and a width W1 of the dielectric cap 109a is greater than a width W2 of the remaining portion of the conductive pillar 107a'. Similarly, a width of the dielectric cap 109b is greater than a width of the remaining portion of the conductive pillar 107b'.

Figure 10:
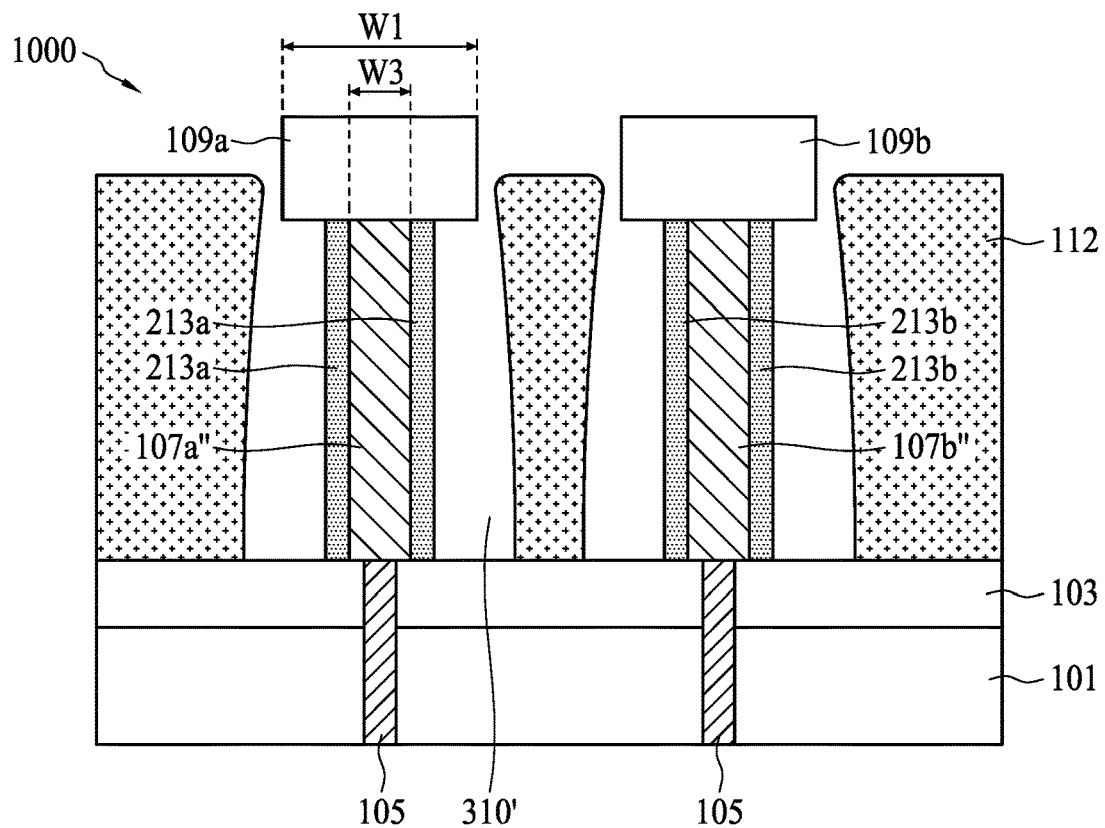

After the transformed portions 113a and 113b are removed, a second heat treatment process may be performed on sidewalls of the remaining portions of the conductive pillars 107a' and 107b', as shown in FIG. 10 in accordance with some embodiments. The second heat treatment process may be optionally performed. For example, in some embodiments, the second heat treatment process can be omitted if the desired widths of the remaining portions of the conductive pillars 107a' and 107b' are reached after the transformed portions 113a and 113b are removed.

Referring to FIG. 10, after the second heat treatment process is performed, sidewall portions of the remaining portions of the conductive pillars 107a' and 107b' are transformed into transformed portions 213a and 213b. As a result, transformed portions 213a and 213b are formed over sidewalls of the remaining portions of the conductive pillars 107a" and 107b", respectively. In some embodiments, a width W3 of the remaining portion of the conductive pillar 107a" is less than the width W2 of the remaining portion of the conductive pillar 107a' before the second heat treatment process is performed, and the width W2 is less than the width W1 of the dielectric cap 109a, as shown in FIG. 9.

After the second heat treatment process, the transformed portions 213a and 213b are removed by an etching process in accordance with some embodiments. Next, another heat treatment process may be selectively performed until the desired widths of the remaining portions of the conductive pillars 107a" and 107b" are reached.

Figure 11:
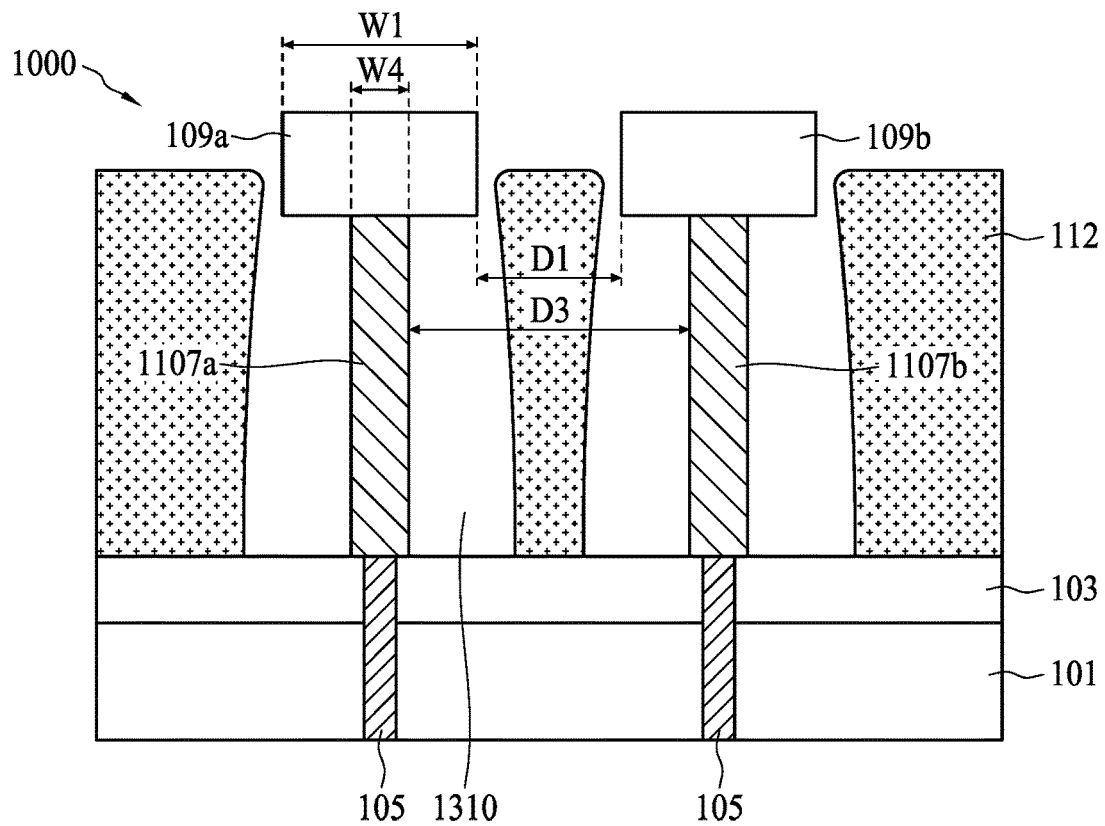

As shown in FIG. 11, remaining portions of the conductive pillars 1107a and 1107b are obtained once the desired widths are reached. In some embodiments, the remaining portions of the conductive pillars 1107a and 1107b serve as through-silicon vias or through substrate vias (TSVs). In some embodiments, after the removal of the transformed portions 213a and 213b, an enlarged opening 1310 is obtained. It should be noted that a distance D3 between the remaining portions of the conductive pillars 1107a and 1107b (i.e., the width of the enlarged opening 1310) is greater than the distance D1 (i.e., the width of the opening 210) between the dielectric caps 109a and 109b, and a width W1 of the dielectric cap 109a is greater than a width W4 of the remaining portion of the conductive pillar 1107a. Similarly, a width of the dielectric cap 109b is greater than a width of the remaining portion of the conductive pillar 1107b.

Moreover, in some embodiments, the remaining portions of the conductive pillars 1107a and 1107b are separated by the opening 1310 in FIG. 11, which is wider than the enlarged opening 310' in FIG. 9. It should be noted that the remaining portions of the conductive pillars 1107a and 1107b are entirely covered by the dielectric caps 109a and 109b, respectively, and the conductive plugs 105 are covered by the remaining portions of the conductive pillars 1107a and 1107b.

In some embodiments, the steps S23 and S25 are performed in the first region 1000, while the second region 2000 is covered by a hard mask; consequently, the conductive pillars 107a over the conductive plug 105 in the second region 2000 are kept the same as that shown in FIG. 3. In other words, the aspect ratio of the conductive pillars 1107a and 1107b serving as semiconductor structures in the first region 1000 is greater than that in the second region 2000.

Figure 12:
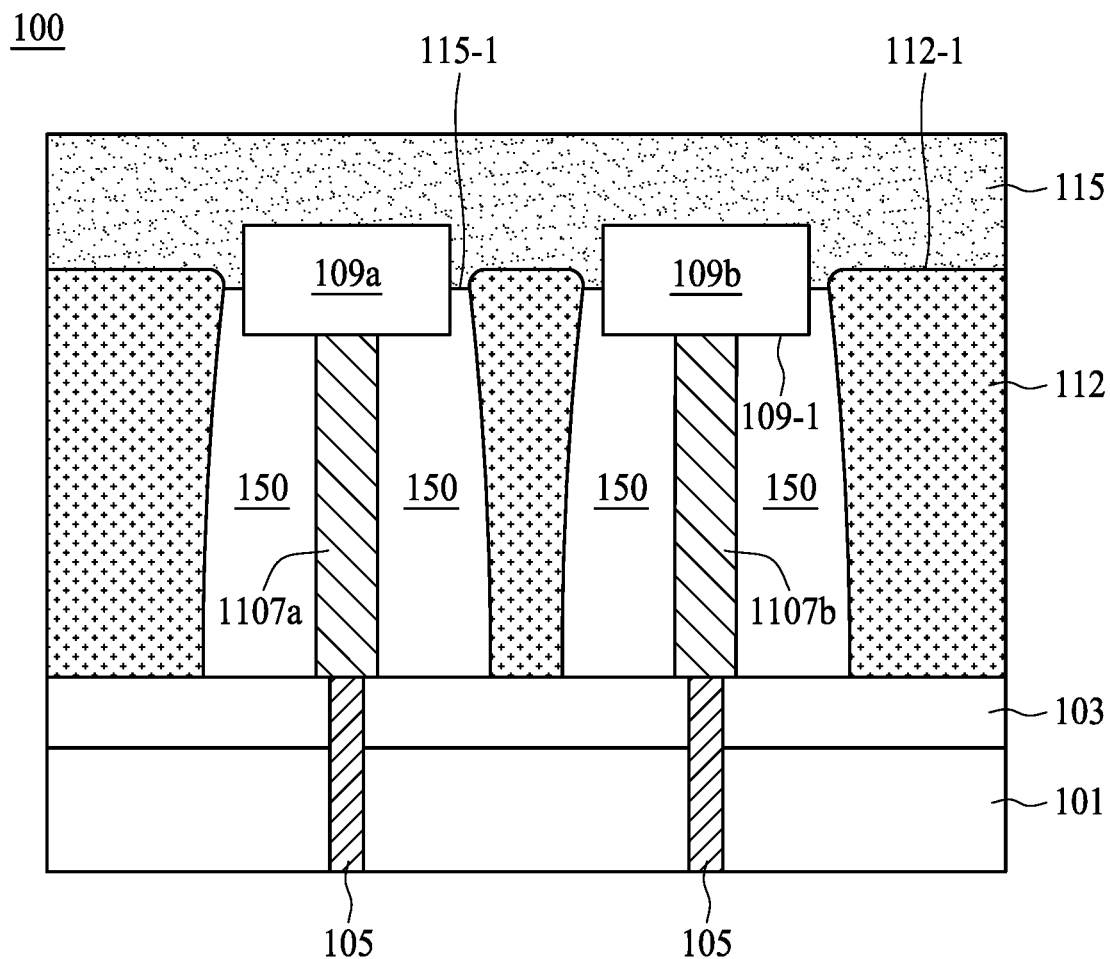

As shown in FIG. 12, the method 10 may further proceed to form a sealing layer 115 such as an inter-layer dielectric (ILD) layer over the dielectric pillars 112 and the dielectric caps 109a, 109b. In some embodiments, the sealing layer 115 covers a portion of sidewalls of the dielectric caps 109a and 109b. Because the width W1 of the dielectric cap 109a (referring to FIG. 11) is greater than the width W4 of the remaining portion of the conductive pillar 1107a, the sealing layer 115 is formed with air gaps 150 enclosed between the dielectric cap 109a, the remaining portion of the conductive pillar 1107a, the dielectric pillar 112 and the sealing layer 115. Similarly, the dielectric cap 109b, the remaining portion of the conductive pillar 1107b, the dielectric pillar 112 and the sealing layer 115 have air gaps 150 enclosed between them.

In some embodiments, the bottom end 115-1 of the sealing layer 115 is lower than the top end 112-1 of the dielectric pillars 112. In some embodiments, the bottom end 115-1 of the sealing layer 115 is higher than the bottom end 109-1 of the dielectric caps 109a and 109b. In some embodiments, the top end 112-1 of the dielectric pillars 112 is higher than the bottom end 109-1 of the dielectric caps 109a and 109b.

In addition, the sealing layer 115 is formed by a deposition process, such as a CVD process, a flowable CVD (FCVD) process, an HDPCVD process, an ALD process, a spin-coating process, another applicable process, or a combination thereof. In some embodiments, the sealing layer 115 is made of silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), and polyimide.

After the deposition process for forming the sealing layer 115 is performed, a planarization process may be performed to remove a portion of the sealing layer 115 and portions of the dielectric caps 109a and 109b, in order to correct deficiencies formed in the dielectric caps 109a and 109b during the previous etching processes. After the planarization process, a semiconductor device 100a is obtained.

[1] The semiconductor structure disclosed in the present disclosure has gaps between the conductive pillars and the dielectric pillars, and the sealing layer seals the gaps from the top to form enclosed air gaps. Since air is a dielectric material with a considerably low dielectric constant, the resultant air gap-dielectric pillar combination between the conductive pillars provides a dielectric structure with lower dielectric constant than that of prior arts. In some embodiments, the dielectric pillars can be manufactured with conventional materials, so the dielectric constant can be lowered without using unfamiliar materials. Thus, the semiconductor structure provided in the present disclosure can reduce the unwanted parasitic capacitance without extensive research and development. As a result, a device using the provided semiconductor structure has an enhanced performance and reasonable cost.

Since conventional materials can be used to form the dielectric pillars in the present disclosure, the method of preparing the semiconductor structure is highly compatible with the prior art. In other words, no new equipment or techniques are required for manufacturing the low κ semiconductor structure.

Embodiments for preparing a semiconductor structure are also provided in accordance with some embodiments of the disclosure. The method for preparing the semiconductor structure includes transforming a sidewall portion of a conductive pillar into a transformed portion (dielectric portion), and then removing the dielectric portion. As the dielectric portion is removed, a width of a dielectric structure over the conductive pillar is greater than a width of a remaining portion of the conductive pillar, while the height of the conductive pillar remains the same. In other words, the aspect ratio of the conductive pillar becomes higher, i.e., the present disclosure can prepare a high aspect ratio conductive pillar, which serves as the semiconductor structure.

In some embodiments of the present disclosure, a semiconductor structure is provided. The semiconductor structure comprises: a substrate; a plurality of conductive pillars disposed over the substrate; a plurality of dielectric pillars, disposed over the substrate, separated from the conductive pillars; a plurality of dielectric caps disposed over the conductive pillars, separated from the dielectric pillars; and a sealing layer disposed over the dielectric pillars and the dielectric caps.

In some embodiments of the present disclosure, a method for preparing a semiconductor structure is provided. The method comprises: forming a plurality of composite pillars over a substrate, wherein the composite pillars include conductive pillars and dielectric caps over the conductive pillars over a substrate; forming a plurality of spacers flanking the composite pillar; forming a plurality of dielectric pillars over the substrate, between the spacers; removing the spacers to expose sidewalls of the conductive pillars; transforming sidewall portions of the conductive pillars into transformed portions; removing the transformed portions; and forming a sealing layer over the dielectric pillars and the dielectric caps.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor structure, comprising:
   forming a plurality of composite pillars over a substrate, wherein the composite pillars include conductive pillars and dielectric caps over the conductive pillars over a substrate;
   forming a plurality of spacers flanking the composite pillar;
   forming a plurality of dielectric pillars over the substrate, between the spacers;
   removing the spacers to expose sidewalls of the conductive pillars;
   transforming sidewall portions of the conductive pillars into transformed portions;
   removing the transformed portions; and
   forming a sealing layer over the dielectric pillars and the dielectric caps.

2. The method for preparing a semiconductor structure of claim 1, wherein a sidewall of the conductive pillar is substantially coplanar with the sidewall of the dielectric cap before the transformed portion of the conductive pillar is formed.

3. The method for preparing a semiconductor structure of claim 1, wherein the step of transforming the sidewall portion of the conductive pillar further comprises:
   performing a heat treatment process on the conductive pillar to form the transformed portion over the sidewall of the conductive pillar, wherein a material of the transformed portion is different from a material of the dielectric cap.

4. The method for preparing a semiconductor structure of claim 3, wherein the heat treatment process is an oxidation process or a nitridation process, and the transformed portion is covered by the dielectric cap.

5. The method for preparing a semiconductor structure of claim 1, wherein the sealing layer covers the dielectric pillars and the dielectric caps such that an air gap is formed between the dielectric cap, the conductive pillar, the dielectric pillar and the sealing layer.

6. The method for preparing a semiconductor structure of claim 1, wherein a bottom end of the sealing layer is lower than a top end of the dielectric pillars.

7. The method for preparing a semiconductor structure of claim 1, wherein a bottom end of the sealing layer is higher than a bottom end of the dielectric caps.

8. The method for preparing a semiconductor structure of claim 1, wherein a top end of the dielectric pillars is higher than a bottom end of the dielectric caps.

9. The method for preparing a semiconductor structure of claim 1, wherein a width of the dielectric cap is greater than a width of the conductive pillars.

10. The method for preparing a semiconductor structure of claim 1, wherein a distance between the conductive pillars is greater than a distance between the dielectric caps.

11. The method for preparing a semiconductor structure of claim 1, wherein a top width of the dielectric pillar is greater than a bottom width of the dielectric pillar, and the bottom width of the dielectric pillar at one side of the conductive pillar is different from a bottom width at another side of the conductive pillar.

* * * * *